United States Patent
Brcka

(10) Patent No.: US 8,480,914 B2
(45) Date of Patent: Jul. 9, 2013

(54) MULTIPLE GAS PLASMA FORMING METHOD AND ICP SOURCE

(76) Inventor: Jozef Brcka, Loudonville, NY (US)

(*) Notice: Subject to any disclaimer, the term of this patent is extended or adjusted under 35 U.S.C. 154(b) by 0 days.

(21) Appl. No.: 13/571,767

(22) Filed: Aug. 10, 2012

(65) Prior Publication Data

US 2012/0329283 A1    Dec. 27, 2012

Related U.S. Application Data

(63) Continuation of application No. 11/694,354, filed on Mar. 30, 2007, now abandoned.

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC .................... 216/68; 438/711; 156/345.48

(58) Field of Classification Search
USPC .................... 216/68; 438/711; 156/345.48
See application file for complete search history.

(56) References Cited

U.S. PATENT DOCUMENTS

| | | | |
|---|---|---|---|
| 5,122,251 A | 6/1992 | Campbell et al. | |
| 5,522,934 A | 6/1996 | Suzuki et al. | |
| 5,683,548 A | 11/1997 | Hartig et al. | |
| 6,112,696 A * | 9/2000 | Gorin | 118/723 IR |
| 6,244,211 B1 | 6/2001 | Nishikawa et al. | |
| 6,578,515 B2 | 6/2003 | Sakamoto et al. | |
| 6,908,862 B2 | 6/2005 | Li et al. | |
| 2003/0200929 A1 | 10/2003 | Otsuki | |

* cited by examiner

*Primary Examiner* — Roberts Culbert
(74) *Attorney, Agent, or Firm* — Wood, Herron & Evans, LLP

(57) ABSTRACT

Different gases are separately exposed to RF energy in different zones in inlets to a processing chamber. Plasma is activated in the gases in each of the zones separately and the activated gases are then introduced into the plasma processing chamber where they may undergo mutual interaction within a processing zone. Control of the active species distribution within the processing chamber is provided by control of the energizing of the gases in the separate inlet zones before they are combined in the processing zone. An ICP source energizes gas in each zone through an antenna having one or more conductors, each of which is coupled to a plurality of the zones. This allows gases to be brought together in their active states, rather than being combined and then activated, and allows the same or different parameters to be applied in different inlet zones.

20 Claims, 5 Drawing Sheets

MULTIPLE GAS PLASMA FORMING METHOD AND ICP SOURCE

This is a continuation of U.S. application Ser. No. 11/694,354, filed Mar. 30, 2007, hereby expressly incorporated by reference.

FIELD OF THE INVENTION

This invention relates to the inductively coupled sources, and particularly to plasma sources for processes that use multiple gases, and to plasma processing systems and reactors.

BACKGROUND OF THE INVENTION

A number of plasma processes, including several used in the manufacture of semiconductor wafers, involve the ionizing of more than one kind of gas or vapor. Often the relative degree of ionization and energy levels of different gases in a plasma make a difference in the effectiveness or quality of the plasma process being performed. For example, downstream plasma used for cleaning, surface preparation and modification, plasma used for wafer processing utilizing preferentially reactive radicals and charged species, plasma enhanced CVD, plasma etching, etc., each are most effective when any given gas is in an optimum energy or ionization state.

The optimum parameters for ionizing different gases in a multiple gas plasma typically differ from one gas to another. However, when gases are mixed, the allocation of energies among the different gas species when energizing a plasma are not readily controlled. As a result, optimal energy distribution or ion fraction ratios of different gases in a plasma are not achieved.

Accordingly, active species distribution among different gases in a multiple gas plasma is in need of improved control, particularly in semiconductor manufacture.

SUMMARY OF THE INVENTION

An objective of the present invention is to better distribute active species and energy among different gases within a plasma.

Another objective of the present invention is to provide independent multiple gas delivery in a plasma state into a reaction chamber at low cost.

According to principles of the present invention, gas and plasma are separately introduced through multiple inlet zones into a plasma processing chamber where they may undergo mutual interaction within a processing zone. Control of the active species distribution within the processing chamber is provided by energizing the gases in the separate inlet zones before combining them in the processing zone.

In accordance with embodiments of the invention, multiple inlet zones are provided through which separate gases can be introduced into a processing chamber, and an inductively coupled plasma (ICP) source is provided to energize the gas in each zone. RF energy is coupled through one or more antennas to energize the gas in each zone. The active species of each of the gases from each zone are combined in a processing chamber after the plasma is formed in the gases. This allows the gases to be brought together in their active states, rather than being combined and then activated. It also allows the same or different parameters to be applied in each of the inlet zones to optimize the conditions for forming plasma in each of the respective gases.

In certain embodiments of the invention, an antenna or coil winding is configured to couple energy into each of a plurality of the inlet zones. As such, the gases in the plurality of zones each appears as an impedance connected in series in the conductor circuit of the antenna. This stabilizes the plasma generation, which is particularly helpful when the ignition of the plasmas in the different inlet zones is not simultaneous or does not present the same impedance. The stabilization allows better control when using a single RF energy source to energize the plasmas in different zones. To provide initial or starting impedance, an easily ignitable gas can be used in one of the inlet zones.

In some embodiments of the invention, a single RF antenna couples energy to all of the inlet zones. In other embodiments, more than one antenna is used, each coupling energy into each of the inlet zones. Other combinations of plural antennas each coupling energy into different combinations of multiple inlet zones may also have increased utility in some systems.

The multiple inlet zones with simple ICP excitation capability are described in axially symmetrical multiple-zone sources and in linearly arranged multiple-zone sources. Other zone configurations can be used depending on the plasma processing system.

In the illustrated embodiments, multiple tubular zones serve as individual local plasma sources. Multiple quartz or ceramic tubes may enclose the separate zones. Instead of multiple ceramic tubes, a single block of dielectric material having multiple pass-through zones can be used. A single inductive antenna is preferably used to deliver RF power to all of the pass-through zones. As such, multiple plasma zones present serial impedances to the RF antenna circuit current, thus avoiding instability that typically results for parallel connected antennas. Because a single antenna is used as an ICP generation tool, a single match box and RF generator can be used.

Examples of antennas that are useful include those that surround the plural zones or are surrounded by an arrangement of plural zones. To compensate for or avoid a standing wave pattern at an antenna, specifically when higher frequencies are used, several independently powered antennas can be used with terminal ends distributed inlets along zone arrangement. For example, a combined serpentine antenna shape can be used. Various geometrical arrangements of the inlet zones can be used, with symmetrical arrangements sometimes preferred, such as annular, rectangular or linear arrangements, and even more complex shapes.

In particular embodiments, common or separate gas inlets can be connected to each local plasma source zones. One or more gases can be used. An advantage of pre-igniting different gases before introduction into a process chamber is that each gas is excited into a plasma state without mixing with another gas, or at-least mixing at significantly reduced concentration of another gas. The pre-ignited gases subsequently interact in the main reaction chamber. With the invention, plasma downstream of the plasma source can be controlled for uniformity. For example, gas flow, RF coupling and other parameters can be controlled among the inlet zones.

The inlet zones can all have the same or similar geometries and dimensions. Alternatively, at least one or more of the inlet zones can have a different geometry or dimensions that differ from those of the other zones. For example, a gas flow cross section or diameter of individual zones can differ, or different perimeter lengths of individual zones that are exposed to the RF can differ. Such differences can be determined based on the individual plasma conditions desired and the ways the gases are to be combined in the chamber.

BRIEF DESCRIPTION OF THE DRAWINGS

These and other objectives and advantages of the present invention will be more readily apparent from the following detailed description, in which.

DETAILED DESCRIPTION OF THE DRAWINGS

Figure 1:
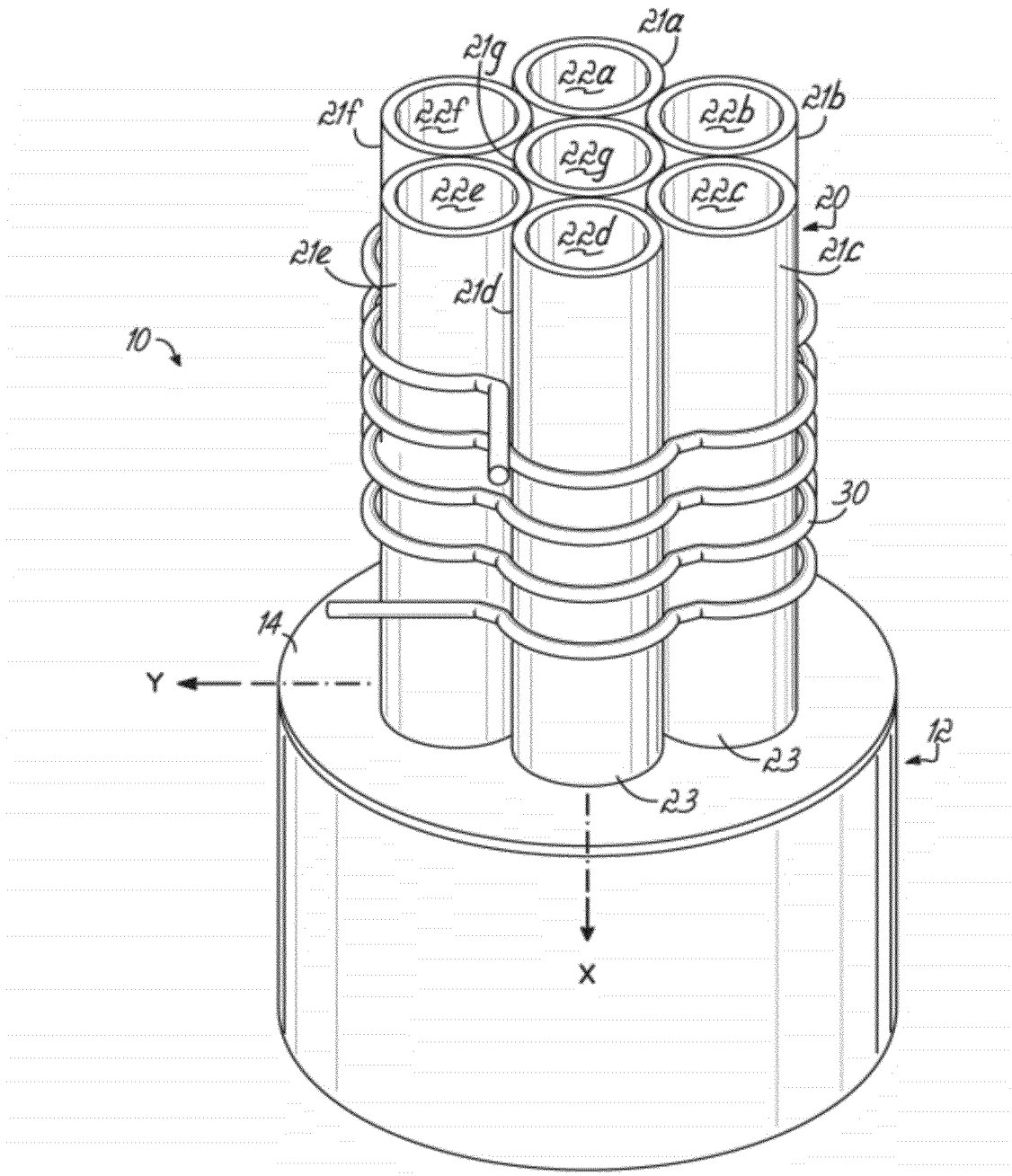
FIG. 1 is a perspective diagram of one embodiment of a plasma processor having a multiflow integrated ICP source according to principles of the invention.
Figure 2:
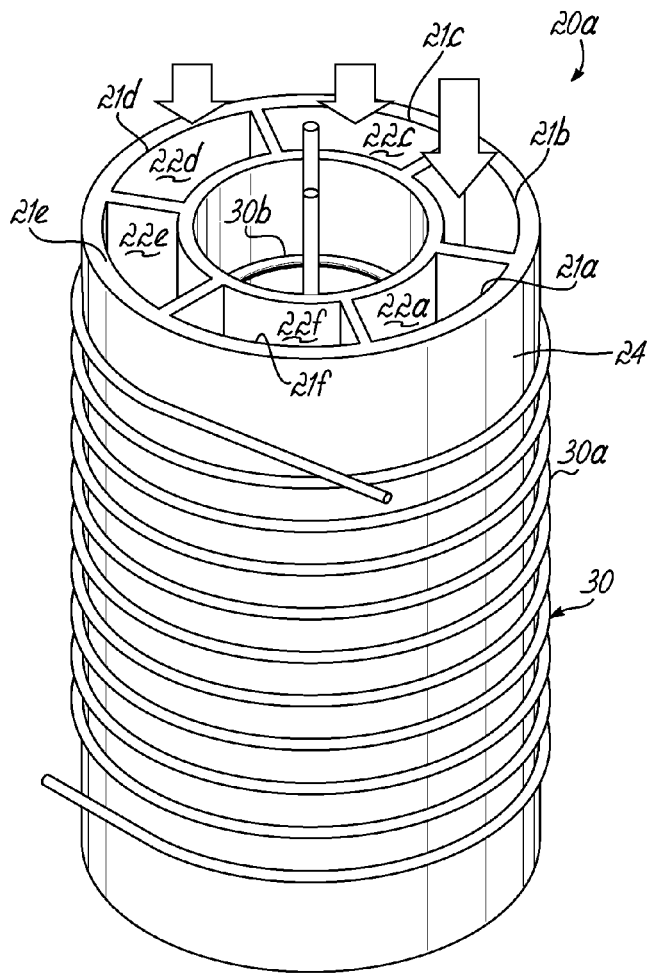
FIG. 2 is a perspective diagram of an alternative embodiment of the multiflow integrated ICP source FIG. 1 according to principles of the invention.

A plasma processor 10, as illustrated in FIG. 1, includes a plasma source 20 that have multiple pass-through zones 21a through 21g, each having a gas flow passage 22a-22g therethrough that communicates with an opening in a top plate 14 of a vacuum processing chamber 12. In the embodiment of FIG. 1, the zones 21a-21g are formed of individual quartz tubes 23 that are bundled together. In the embodiment of FIG. 2, a plasma source 20a is illustrated having zones 21a-21g that are formed of a single block of dielectric material 24. An inductive antenna 30 surrounds the tubes 23 in FIG. 1 and is coupled to an appropriate source (not shown) of RF power. The use of generally circular shapes in FIGS. 1 and 2 provides some desirable symmetry, but other shapes can be used, and the cross-sectional shapes of the zones 21a-21g which can be selected to as most suitable for the given substrate geometry, size and uniformity requirements, and gas ratios Annular, rectangular, linear, or more complex shapes of geometrical cross sections may be suitable for particular applications. The material for the tubes 23 or block 24 can be any number of dielectric or insulating materials of choice, such are quartz, alumina, AlN, silicon carbide, or other appropriate materials. For example, single block design can be easily made from bulk TEFLON material.

In FIG. 1, the antenna 30 is a single inductive outer conductor, which delivers RF power to all seven of the pass-through zones 21a-21g of this embodiment. As such, the multiple plasma zones 21a-21g present serial impedances to the RF current, which helps avoid the instability that is typical of parallel connected impedances. Because the single antenna 30 is used for ICP generation, a single match box 51 and RF generator 50 can be used to supply power to all of the zones 21.

In FIG. 2, both an outer antenna 30a and an inner antenna 30b are provided, either one or both of which may be used. For antenna dimensions in range from 10 to 40 cm, the inductance of several loops of antennae is several microHenries (mH). For instance, antenna 30 in FIG. 1 has a 3.6 mH inductance, while the inductance of the outer antenna 30a in FIG. 2 is about 9.3 mH and of the inner antenna 30b is about 3.7 mH.

In FIG. 2, both an outer antenna 30a and an inner antenna 30b are provided, either one or both of which may be used. For antenna dimensions in range from 10 to 40 cm, the inductance of several loops of antennae is several microHenries (mH).

A common frequency for the antenna 30 is 13.56 MHz. At much higher frequencies, a standing wave pattern may be generated along the antenna, and generates much higher voltages at the antenna ends. To compensate for such a standing wave pattern on the antenna, several independently powered antennas can be used with distributed inlets along the plasma shape.

Figure 3:
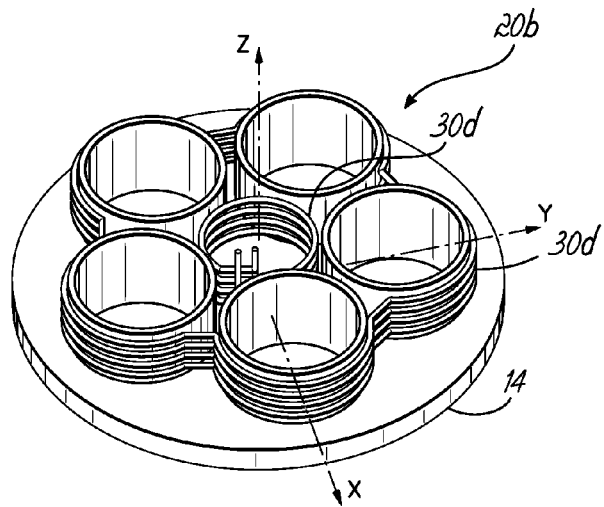
FIG. 3 is a perspective diagram, similar to FIGS. 1 and 2, of further embodiment of a multiflow integrated ICP source according to principles of the invention.
Figure 4A:
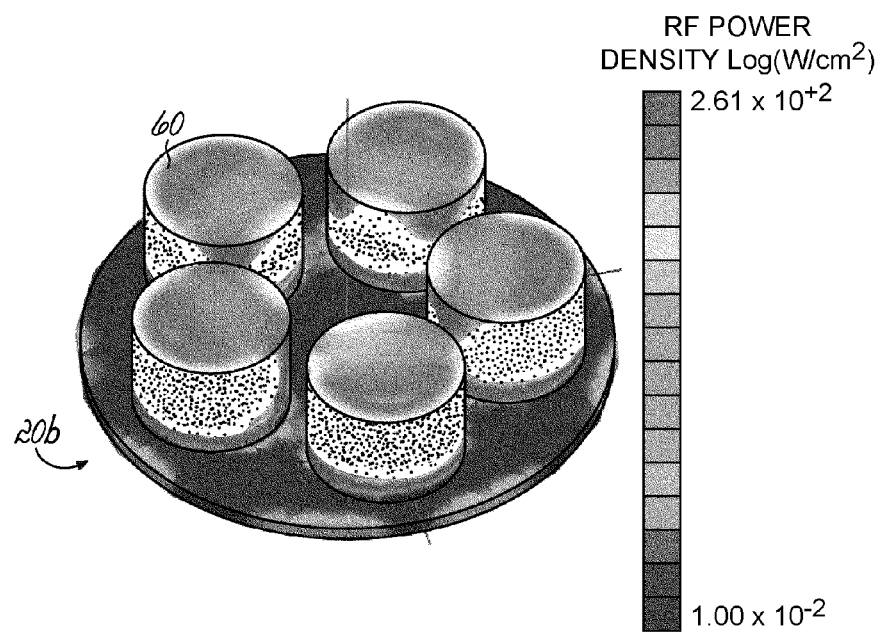
FIG. 4A is a power density distribution graph of the embodiment of FIG. 3.
Figure 4B:
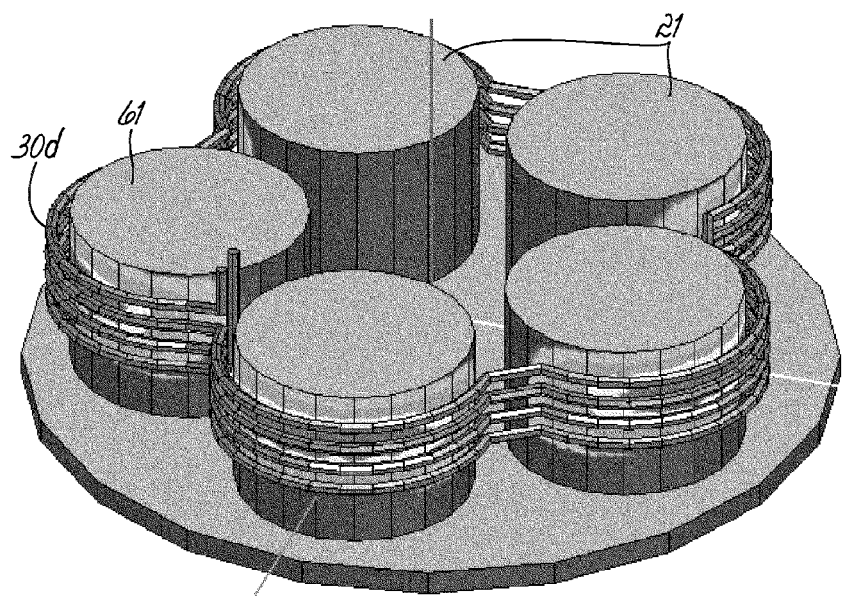
FIG. 4B is a power density distribution graph, similar to FIG. 4A, illustrating the embodiment of FIG. 3 with only the large outer inductive antenna energized.
Figure 5:
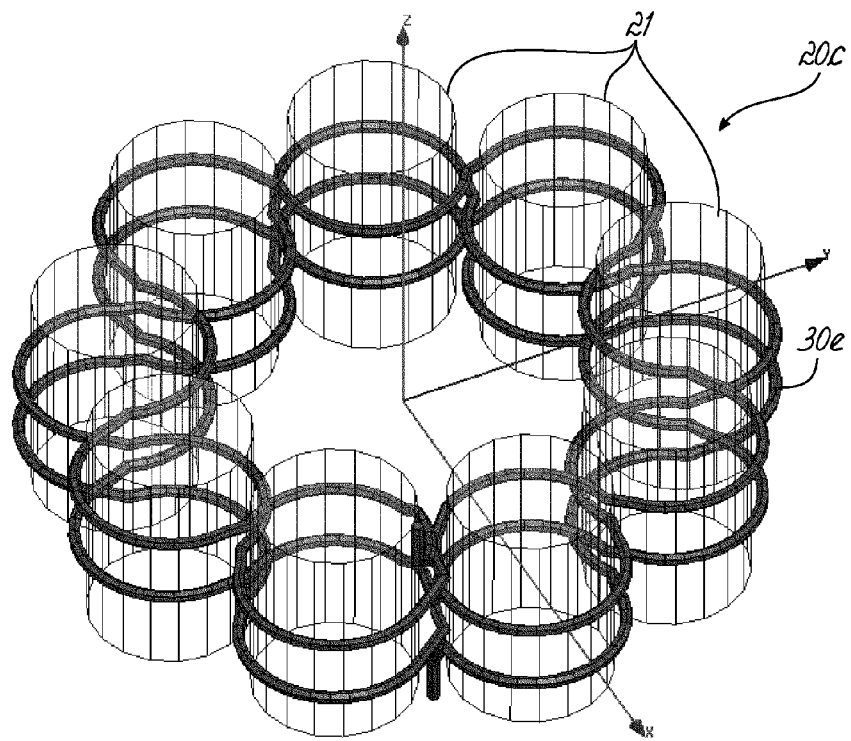
FIG. 5 is a perspective diagram, similar to FIGS. 1, 2 and 3 of still another embodiment of a multiflow integrated ICP source according to principles of the invention.

FIG. 3 shows a plasma source 20b, which, as with the source 20a of FIG. 2, has multiple zones 21 in a chamber top plate 14, and two antennas, an outer antenna 30c and an inner antenna 30d, utilized to form plasma in the multiple-flow ICP source 20b. FIG. 4A shows the power distribution in the source 20b with both antennas 30c and 30d energized, where the lighter regions depict power concentrations around both the outer and inner edges of the zones. FIG. 4B illustrates the RF power distribution 61 in the individual zones 21 due to the outer antenna 30d only, with the lighter regions showing power concentrations highest near the outer surfaces of the zones. More complex antenna shapes are possible to use due to the structured source design. For example, in FIG. 5, an annular antenna 30e with a serpentine, sinuous, or alternating "S" conductor used to deliver power into all zones 21.

Figure 6:
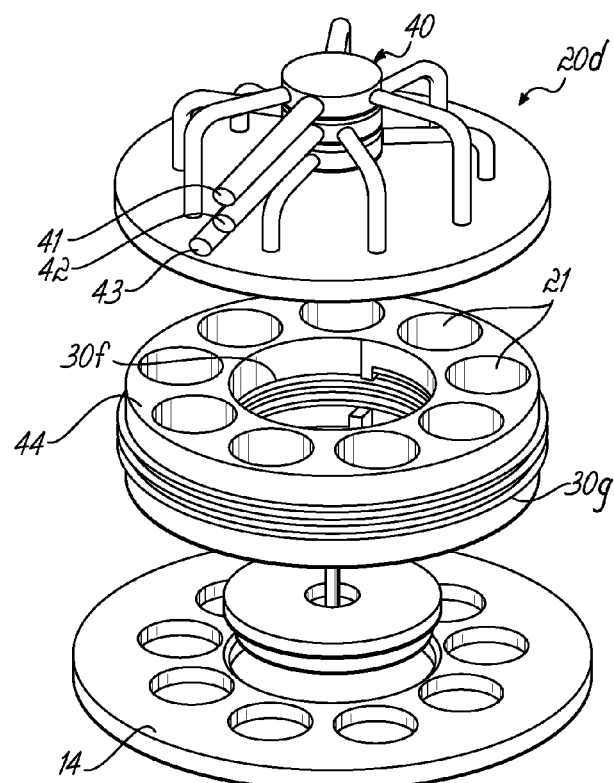
FIG. 6 is a perspective diagram, similar to FIGS. 1-3 and 5 of yet another embodiment of a multiflow integrated ICP source according to principles of the invention.

FIG. 6 illustrates a source 20d shown in a disassembled perspective view. The zones 21 are formed in a single annular quartz block 44 that is fixed to a chamber top plate 14. Common or separate gas inlets can be connected to each local plasma source zones 21. Two antennas are provided, including an annular inner antenna 30f around the inner opening of the block 44, as is an annular outer antenna 30g, that surrounds the outside of the block 44. Flow rates can be individually controlled in each of the zones 21 by using conventional gas control components. One or more gases can be fed to each individual zone, and different gases that are to be used for processing in the chamber 12 can be supplied to different ones of the zones, thereby allowing each gas to be excited into a plasma state without or before mixing with the other gases, or at least while at a significantly lower concentration of the other gases, than will ultimately be reached in the chamber 12. The plasma gases, after plasma creation, are introduced into the chamber 12 where they interact in the main reaction chamber 12. An example of the gas manifold 40 for three different gases sources 41, 42 and 43 is illustrated in FIG. 6.

Figure 7:
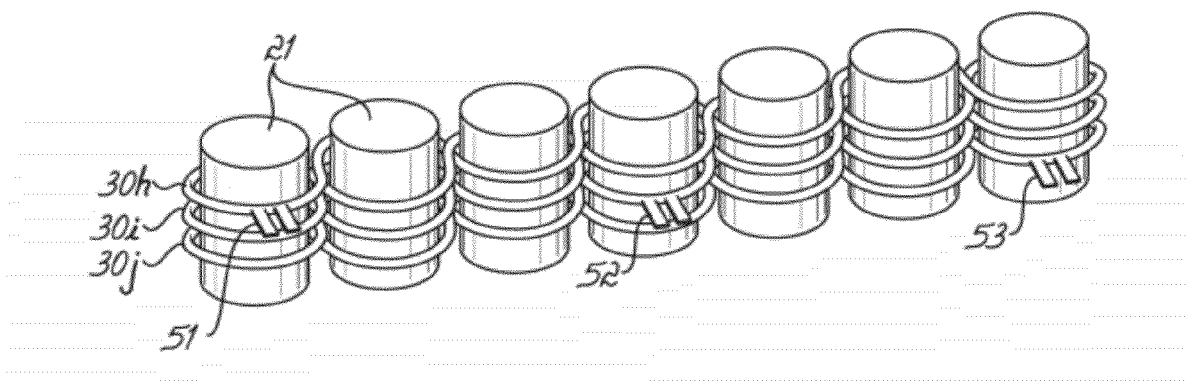
FIG. 7 is a perspective diagram, similar to FIGS. 1-3, 5 and 6 of an linear embodiment of a multiflow integrated ICP source according to principles of the invention.

In the embodiment of FIG. 7, the zones 21 are defined within separate quartz tubes 22, all of which are surrounded by each of three single antennas 30h, 30i and 30j. Each of the antennas 30h, 30i and 30j has an inductance of about 1.1 mH. When using three such antennas in parallel, 370 nanoHenries (nH) only will be experienced. Such values of the inductance are easily implementable for RF excitation at frequencies in the range of 100 s of kHz up to 10 s of MHz. The three antennas 30h, 30i and 30j are connected in parallel with respect to one another. With the antennas 30h, 30i and 30j, standing wave dispersion can be provided by staggering the antenna ends 50h, 50i and 50j, as illustrated in FIG. 7, or by phasing the RF power on the different antennas 30h, 30i and 30j to allow the antenna ends 50 to align.

In each of the embodiments described above, each of the antennas 30 couples power into each of the zones 21, so that each antenna circuit includes series impedances from each of the zones. This enhances the stability of the plasma excitation system.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of controlling energy distribution and ion fraction among different gases in a multiple-gas plasma, comprising:
   injecting a plurality of different gases or different gas mixtures into a processing chamber, each through a different one of a plurality of separately confined inlet zones;
   inductively coupling RF energy into each of the separately confined inlet zones to energize to an active state each of the different gases being injected there-through to form plasmas in each of the different gases in the separately confined inlet zones; then,
   flowing the plurality of different energized gases, in their active states, from each of the inlet zones into the processing chamber and combining the plurality of different energized gases in the processing chamber to form a multiple-gas plasma therein; and
   processing a semiconductor wafer with the multiple-gas plasma in the processing chamber.

2. The method of claim 1 further comprising:
   differently controlling at least one parameter of the injecting of the gases or of the energization of the plasmas to differently affect the energy distribution or ion fraction among the different energized gases being injected through the plurality of separately confined zones.

3. The method of claim 2 wherein:
   the differently controlling of the at least one parameter includes separately controlling gas flow of different gases among the different inlet zones.

4. The method of claim 3 wherein:
   the differently controlling of the at least one parameter includes differently controlling RF energy coupled into the different inlet zones.

5. The method of claim 4 wherein the method is performed in a plasma processing apparatus comprising:
   the processing chamber;
   a plurality of gas supplies each containing a different one of the plurality of different gases;
   the plurality of separately confined inlet zones, each at least partially enclosed by a dielectric material and each communicating a different one of the plurality of different gases or different gas mixtures from one or more of the gas supplies to the processing chamber, each of the inlet zones being sufficiently large to allow a plasma to be maintained in a gas therein; and
   an RF energy source including an RF generator and at least one antenna connected to the generator and inductively coupled through the dielectric material to each of the inlet zones of the plurality of inlet zones.

6. A method of controlling energy distribution or ion fraction among different gases in a multiple gas plasma, comprising:
   providing a plasma processing apparatus comprising a processing chamber and a plurality of inlet zones, each of the inlet zones being connected between the processing chamber a plurality of gas supplies, each of the inlet zones being sufficiently large to allow a plasma to be maintained in a gas therein, and an RF energy source including an RF generator and one or more antennas connected to the generator and configured to inductively couple RF energy through the dielectric material into each of the inlet zones to energize a plasma in gases separately confined therein before the gases combine in the processing chamber;
   supplying a different gas or different gas mixture to different ones of the inlet zones;
   energizing different gases in the plurality of inlet zones with RF energy coupled therein to form an inductively coupled plasma in different gases in different ones of the inlet zones;
   combining in the processing chamber the energized different gases from the different inlet zones to form a multiple gas plasma therein; and
   processing a semiconductor wafer with multiple gas plasma in the processing chamber.

7. The method of claim 6 further comprising:
   differently controlling at least one parameter of the injecting of the gases or the energization of the plasmas to differently affect the energy distribution or ion fraction among the plasmas in the different gases being injected through the separately confined inlet zones.

8. The method of claim 7 wherein:
   the differently controlling of the at least one parameter includes separately controlling gas flow of different gases among the different inlet zones.

9. The method of claim 8 wherein:
   The differently controlling of the at least one parameter includes differently controlling RF energy coupled into the different inlet zones.

10. The method of claim 1, wherein the method is performed using multiple-gas, inductively-coupled-plasma processing apparatus that comprises:
    the processing chamber having the semiconductor wafer support therein;
    a plurality of gas supplies, each containing a corresponding one of the plurality of different gases or different gas mixtures;
    the plurality of inlet zones, each enclosed by a dielectric material, and each connected to one or more of the gas supplies, and each providing a gas flow path for communicating one of the different gases or different gas mixture thereof to the processing chamber, each of the inlet zones being sufficiently large to allow a plasma to be formed in a gas therein; and
    a controlled RF energy source including an RF generator and one or more antennas connected to the generator and configured to inductively couple RF energy through the dielectric material into each of the inlet zones, the source being controlled to pre-ignite a plasma in the gas or gas mixture therein before the gases from the inlet zones combine in the processing chamber by separately controlling one or more of the gas flow or the coupled RF energy among different inlet zones.

11. The method of claim 10 wherein the one or more antennas includes a only single conductor surrounding the dielectric material and configured to inductively couple RF energy from the RF energy source through the material to energize the plasma in each of the inlet zones of the plurality.

12. The method of claim 10 wherein the one or more antennas includes at least one conductor configured to inductively couple RF energy to a plurality of the inlet zones.

13. The method of claim 10 wherein:
the dielectric material includes a plurality of dielectric tubes arranged in a ring, each tube surrounding one of the inlet zones, each zone forming a gas conductance path that defines a plasma source between one or more of the gas supplies and the processing chamber.

14. The method of claim 10 further comprising:
a block of dielectric material having a plurality of gas passages therethrough, each forming one of the inlet zones, each zone providing a gas conductance path from one or more of the gas supplies to the processing chamber.

15. The method of claim 10 wherein:
the plurality of inlet zones are arranged in a ring, each zone forming a conductance path for gas flowing from one or more of the gas supplies to the processing chamber; and
the one or more antennas includes a conductor surrounding each of the inlet zones and configured to inductively couple RF energy into the zones so as to separately energize a plasma in a plurality of different gases or gas mixtures flowing through the inlet zones before the gases enter and combine the processing chamber.

16. The method of claim 10 wherein:
the plurality of inlet zones are arranged in an annular array having an opening at its center, each zone forming a conductance path for gas flowing from one or more of the gas supplies to the processing chamber; and
the one or more antennas includes a conductor surrounding the opening in the center of the array and inductively coupled to each of the zones so as to separately energize a plasma in a plurality of different gases flowing through each of the zones before the gases enter the processing chamber.

17. The method of claim 10 wherein:
the inlet zones are arranged in an annular array having an opening at its center, each zone forming a conductance path for gas flowing from one or more of the gas supplies to the processing chamber; and
the one or more antennas includes at least two conductors, one conductor surrounding the opening in the center of the array and inductively coupled to each of the zones so as to separately energize a plasma in a plurality of different gases flowing through each of the zones before the gases enter the processing chamber, and the other conductor surrounding the array of zones and being inductively coupled thereto so as to also separately energize the plasma in the gases flowing through each of the zones before the gases enter the processing chamber.

18. The method of claim 10 wherein each of the zones is separately enclosed in a dielectric tube and the one or more antennas includes at least one conductor separately wound around each of the zones of the plurality.

19. The method of claim 10 wherein the one or more antennas includes a plurality of conductors, each separately wound around each of the zones of the plurality.

20. The method of claim 10 wherein:
the at one or more antennas includes a plurality of conductors, each wound around each of the zones of the plurality and inductively coupled thereto;
each conductor being connected in parallel across the RF generator and having a pair of end terminals, and either:
the terminal ends of different conductors being staggered among the zones, or
the conductors being phased relative to each other.

* * * * *

UNITED STATES PATENT AND TRADEMARK OFFICE
CERTIFICATE OF CORRECTION

PATENT NO. : 8,480,914 B2  
APPLICATION NO. : 13/571767  
DATED : July 9, 2013  
INVENTOR(S) : Jozef Brcka Page 1 of 1

It is certified that error appears in the above-identified patent and that said Letters Patent is hereby corrected as shown below:

In the Specification:

In Col. 2, line 49, "source zones." should read --source zone.--.

In Col. 2, line 53, "or at-least" should read --or at least--.

In Col. 3, line 34, "that have multiple" should read --that has multiple--.

In Col. 3, line 47, "selected to as most" should read --selected as most--.

In Col. 3, line 48, "gas ratios Annular," should read --gas ratios. Annular,--.

In Col. 4, line 33, "conductor used" should read --conductor is used--.

In the Claims:

In Col. 6, line 1, Claim 6, "chamber a plurality" should read --chamber and a plurality--.

In Col. 6, line 20, Claim 6, "with multiple gas;" should read --with the multiple gas;--.

In Col. 6, line 61, Claim 11, "includes a only single" should read --includes only a single--.

In Col. 7, line 22, Claim 15, "combine the processing chamber" should read --combine in the processing chamber--.

In Col. 8, line 24, Claim 20, "the at one or more" should read --the one or more--.

Signed and Sealed this  
Seventh Day of October, 2014

Michelle K. Lee  
*Deputy Director of the United States Patent and Trademark Office*